United States Patent [19]
Shimizu et al.

[11] 4,116,719
[45] Sep. 26, 1978

[54] METHOD OF MAKING SEMICONDUCTOR DEVICE WITH PN JUNCTION IN STACKING-FAULT FREE ZONE

[75] Inventors: Hirofumi Shimizu, Kodaira; Akira Yoshinaka, Hamuramachi; Yoshimitsu Sugita, Kokubunji, all of Japan

[73] Assignee: Hitachi, Ltd., Japan

[21] Appl. No.: 766,727

[22] Filed: Feb. 8, 1977

[30] Foreign Application Priority Data

Feb. 12, 1976 [JP] Japan .................. 51-13234

[51] Int. Cl.² .............. H01L 7/52; H01L 11/14
[52] U.S. Cl. .................. 148/1.5; 148/191; 357/23; 357/88
[58] Field of Search ............ 148/1.5; 357/91, 23, 357/88

[56] References Cited
U.S. PATENT DOCUMENTS

| 3,669,768 | 6/1972 | Beadle et al. | 148/187 |
| 3,867,196 | 2/1975 | Richman | 148/1.5 |
| 3,997,368 | 12/1976 | Pétroff et al. | 148/1.5 |

OTHER PUBLICATIONS

G. A. Rozgonyi, et al., ".... Oxidation–Induced Stacking Fault by Preoxidation .... Si Wafers," J. Electr. Soc. 122, (1975), 1725.
Y. Sugita, et al., ".... Stacking Fault Generation in (111) Si Wafers," J. Electronics Mat. 4, (1975), 175.
H. Shiraki, "Si Wafer Annealing Effect in Loop Defect Generation," Jap. J. Appl. Phys. 13, (1974), p. 1514.
K. V. Ravi, "On the Annihilation of Oxidation Induced Stacking Faults in Si," Phil. Mag. 30, (1974), 1081.

*Primary Examiner*—R. Dean
*Assistant Examiner*—Upendra Roy
*Attorney, Agent, or Firm*—Craig & Antonelli

[57] ABSTRACT

In a method of making a semiconductor device, a semiconductor wafer having a stacking fault originally contained in the wafer or produced in the wafer through the thermal oxidation of the wafer surface is subjected to an annealing treatment in a non-oxidative atmosphere to eliminate the stacking fault. A PN junction is thereafter formed in an area of the wafer from which the stacking fault is eliminated.

13 Claims, 16 Drawing Figures

METHOD OF MAKING SEMICONDUCTOR DEVICE WITH PN JUNCTION IN STACKING-FAULT FREE ZONE

BACKGROUND OF THE DISCLOSURE

The present invention relates to a method of making a semiconductor device with a PN junction.

As well known, most of methods of making semiconductor devices with PN junctions employ planar techniques using a silicon wafer as a starting material. In accordance with the planar technique, a silicon oxide ($SiO_2$) film is formed on a surface of the silicon wafer through the thermal oxidation thereof in an atmosphere containing oxygen. By use of diffusion technique, a junction structure is formed in which a PN junction extends beneath the $SiO_2$ film and to the silicon wafer surface at its edges.

Such a method using the planar technique has an advantage that the $SiO_2$ film formed on the silicon wafer surface serves as both a surface protection film and a mask for preventing the penetration of impurities into the junction structure. On the other hand, it has been required that recent semiconductor devices must have high performance, high reliability and high integration density. Correspondingly, the manufacture process has been complicated and it has been required to form fine structures with higher accuracy. Moreover, the produced device must have correct characteristics. Attempts to such requirements have revealed that the formation of the $SiO_2$ film provides a factor which limits various characteristics of the device.

A great problem is that in forming the $SiO_2$ film on the silicon wafer surface a "stacking fault" is produced at the interface between the $SiO_2$ film and the silicon wafer and in the silicon wafer. In general, a "stacking fault" is known as a defect in a crystal in which there is a change from the regular sequence of positions of atomic planes. The stacking fault increases or grows through heat treatments during the manufacture process, thereby deteriorating the geometry of the formed PN junction, the electrical characteristics thereof (especially, breakdown voltage, leakage current characteristic and noise characteristic) and the yield in production.

Various approaches have been made to solve the problem of stacking fault. However, no sufficient solution has been attained. On the other hand, the increasing requirement for higher integration density is imposed upon recent semiconductor devices or integrated circuits. Further, the requirement for linear integrated circuits is directed to low noise and the improvement of reliability. It is accordingly urgent to provide a silicon wafer with its improved characteristics of crystal.

SUMMARY OF THE INVENTION

The present invention is made to eliminate the above-described problem while satisfying various conditions required for recent semiconductor devices and its object is to remove a stacking fault originally contained or produced in a semiconductor wafer to provide a semiconductor device with a PN junction which has high performance and high reliability and whose fine structure can be formed with higher accuracy.

According to the present invention, a semiconductor wafer having a stacking fault originally contained in the wafer or produced in the wafer through the thermal oxidation of the wafer surface in an oxidative atmosphere is subjected to an annealing treatment under a predetermined condition in an inoxidative atmosphere to eliminate the stacking fault. A PN junction is thereafter formed in an area of the semiconductor wafer from which the stacking fault is eliminated.

DESCRIPTION OF THE PREFERRED EMBODIMENTS

A method of making a MOS integrated circuit device in accordance with an embodiment of the present invention will now be explained referring to FIGS. 1 to 8.

Figure 1:
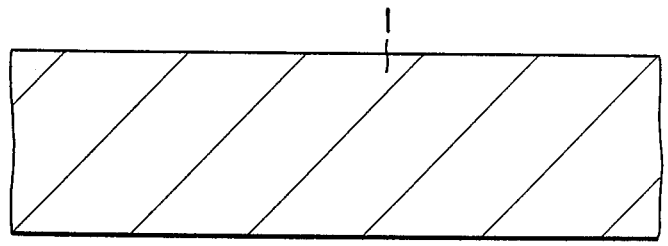
FIGS. 1 to 8 show, in cross section, sequential process steps for making a MOS integrated circuit device in accordance with an embodiment of the present invention.
Figure 2:
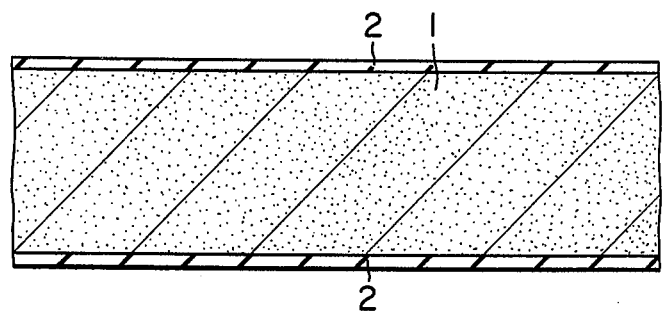
Figure 3:
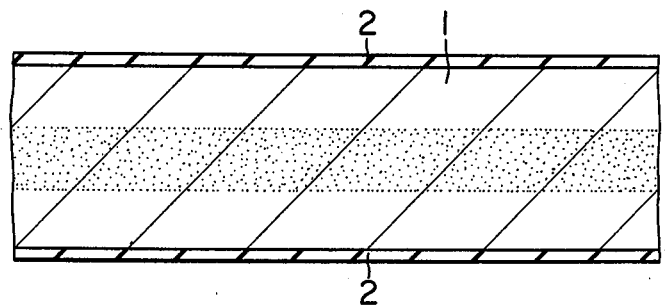

FIG. 1 shows a silicon wafer 1 as a starting material. After the surface of the wafer 1 has been cleaned, the wafer 1 is placed within a furnace maintained at a high temperature (for example, 1100° C) and is subjected to a heat treatment for several hours in an oxidative atmosphere containing an oxidative gas such as oxygen gas or vapor of water to form a $SiO_2$ film on the surface of the silicon wafer 1 as shown in FIG. 2. In this thermal oxidation process, the growth of the $SiO_2$ film advances in such a manner that oxygen from the exterior passes through the formed $SiO_2$ film and reaches the interface between the $SiO_2$ film and the silicon wafer. Therefore, a stacking fault is produced widely in the silicon wafer 1. In FIG. 2, the stacking fault is illustrated in the form of grains or dots.

To eliminate the stacking fault, the wafer is subjected to an annealing treatment at high temperatures (for example, 700° to 1250° C) for 2 to 5 hours in a non-oxidative atmosphere such as vacuum state or nitrogen gas. In a typical example, the annealing treatment at 1150° C for 3 hours in an atmosphere containing a nitrogen gas is carried to eliminate the stacking fault in a range from the wafer surface to the depth of 18 μm (see FIG. 3).

Once the annealing treatment characteristic of the present invention has been carried out in the non-oxidative atmosphere at high temperatures for a predetermined time to eliminate the stacking fault existing in the silicon wafer, no regeneration of stacking fault takes place even if thermal oxidation and/or diffusion processes at high temperatures are thereafter carried out. This fact revealed by the present inventors will be described later on the basis of the results of experiment.

As shown in FIGS. 4 to 8, a PN junction is formed in an area of the silicon wafer 1 from which the stacking fault is eliminated, so that a desired MOS integrated circuit device having such an active region is produced.

Figure 4:
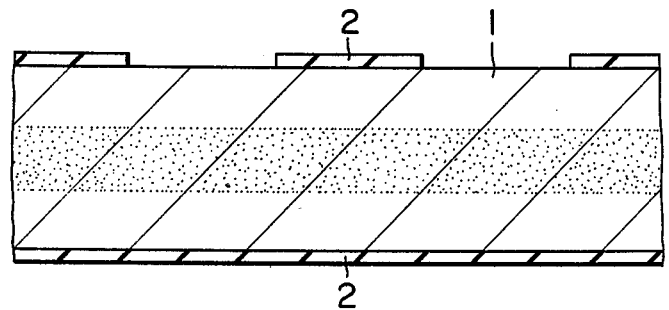
Figure 5:
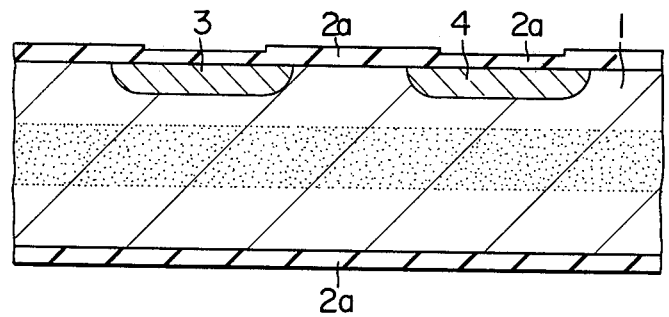
Figure 6:
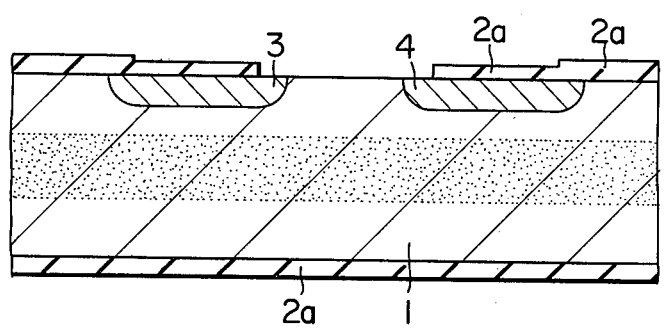

Referring to FIG. 4, the $SiO_2$ film 2 is patterned by etching portions of the $SiO_2$ film 2 where source and drain regions are to be formed. By using the patterned $SiO_2$ film 2 as a mask, impurities having a conductivity type opposite to that of the silicon wafer are diffused from the exposed surface of the silicon wafer 1 to form source and drain regions 3 and 4 in the area free of the stacking fault (see FIG. 5). Simultaneously, a new $SiO_2$ film 2a as a field oxide is formed at the time of the heat treatment for forming the source and drain regions 3 and 4. During this diffusion or thermal oxidation process, no new stacking fault is produced in the silicon wafer 1 and there is no increase or growth of the stacking fault existing in the wafer 1.

Figure 7:
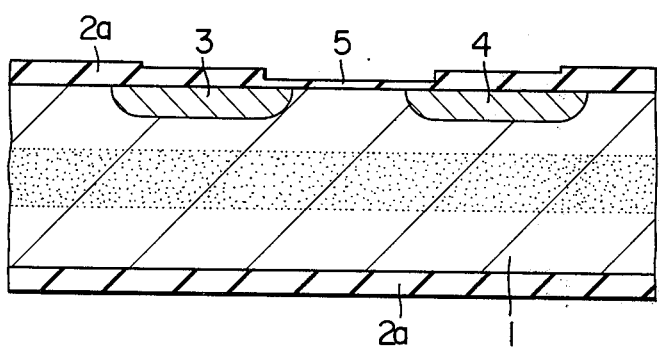
Figure 8:
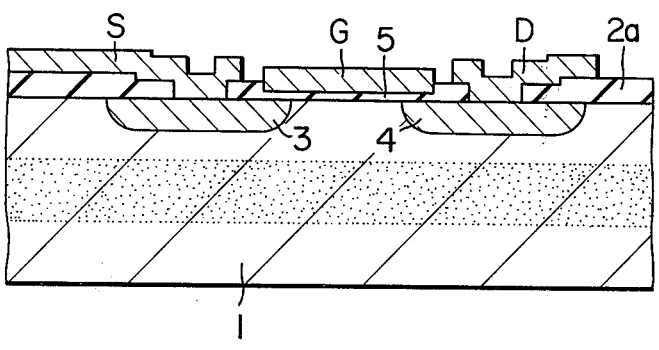

Next, the SiO$_2$ film 2a positionally corresponding to a gate region is etched away (see FIG. 6) and a silicon oxide (SiO$_2$) film 5 for gate is formed on the exposed wafer surface through thermal oxidation (see FIG. 7). In this thermal oxidation process, too, no new stacking fault is produced and there is no increase or growth of the stacking fault existing in the wafer 1.

Thereafter, openings for contacts are provided in the SiO$_2$ film 2a and a layer of aluminum is vapor-deposited. The aluminum layer is patterned by photo-etching to provide desired interconnections, source contact S and drain contact D (see FIG. 8).

It will be understood that the resultant structure is subjected to the division to chips and the packing thereof to complete MOS integrated circuit devices.

As described above, the stacking fault generated in the silicon wafer 1 in forming the SiO$_2$ film 2 on the surface of the silicon wafer 1 is eliminated by the annealing treatment at high temperatures in a non-oxidative atmosphere. Even if heat treatments and/or diffusion processes are subsequently carried out, no new stacking fault generates and there is no growth of the stacking fault which exists in the silicon wafer 1 and which may optionally remain an area of the silicon wafer other than the area from which the previous stacking fault is eliminated. This effect has been found by the present inventors.

Figure 9:
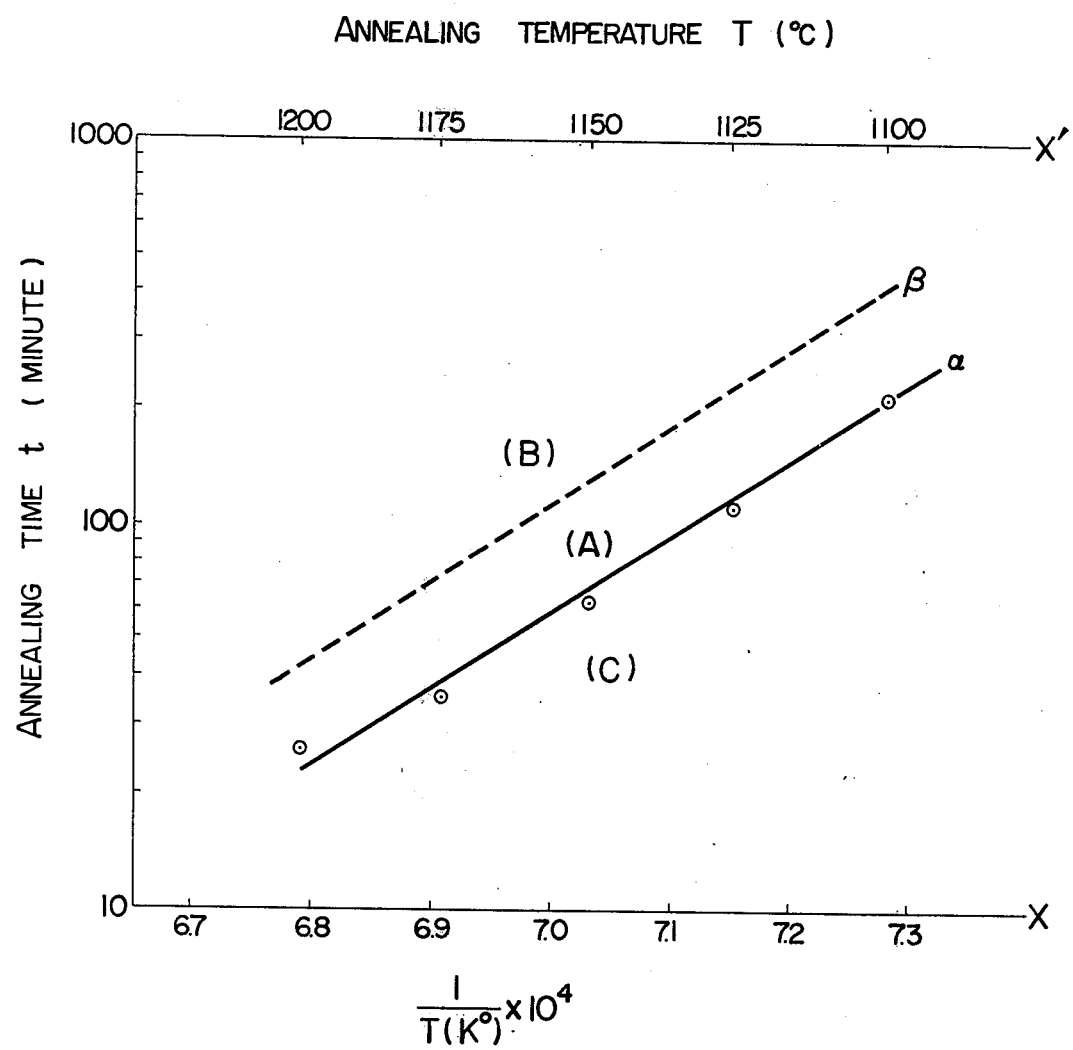
FIGS. 9 and 10 graphically show the results of experiment for explaining the present invention.

As the results of experiment by the present inventors, FIG. 9 shows a relation of the removal of stacking fault in the silicon wafer 1 to various annealing conditions (or annealing temperature T and annealing time t). In the figure, a solid line $\alpha$ is a plot of annealing temperatures T and times t required for eliminating the stacking fault in a range from the surface of the silicon wafer 1 to the depth of 7 $\mu$m. A dotted line $\beta$ is a plot of limits of annealing temperatures T and time t at which the reoxidation of the silicon wafer surface produces no new stacking fault in an area of the silicon wafer which from the previous stacking fault has been eliminated or an area of the silicon wafer from the surface to the depth of 7 $\mu$m. Thus, a region A between lines $\alpha$ and $\beta$ represents the conditions of annealing under which the stacking fault contained in the silicon wafer can be eliminated by the annealing treatment but a new stacking fault is produced during subsequent thermal oxidation and/or diffusion process. A region B between the line $\beta$ and an abscissa X' represents the conditions of annealing under which the stacking fault can be eliminated by the annealing treatment and the subsequent thermal oxidation and/or diffusion process does not result in the generation or growth of a new stacking fault. A region C between line $\alpha$ and an abscissa X represents the conditions of annealing under which the stacking fault contained in the silicon wafer is not eliminated even by the annealing treatment.

Figure 10:
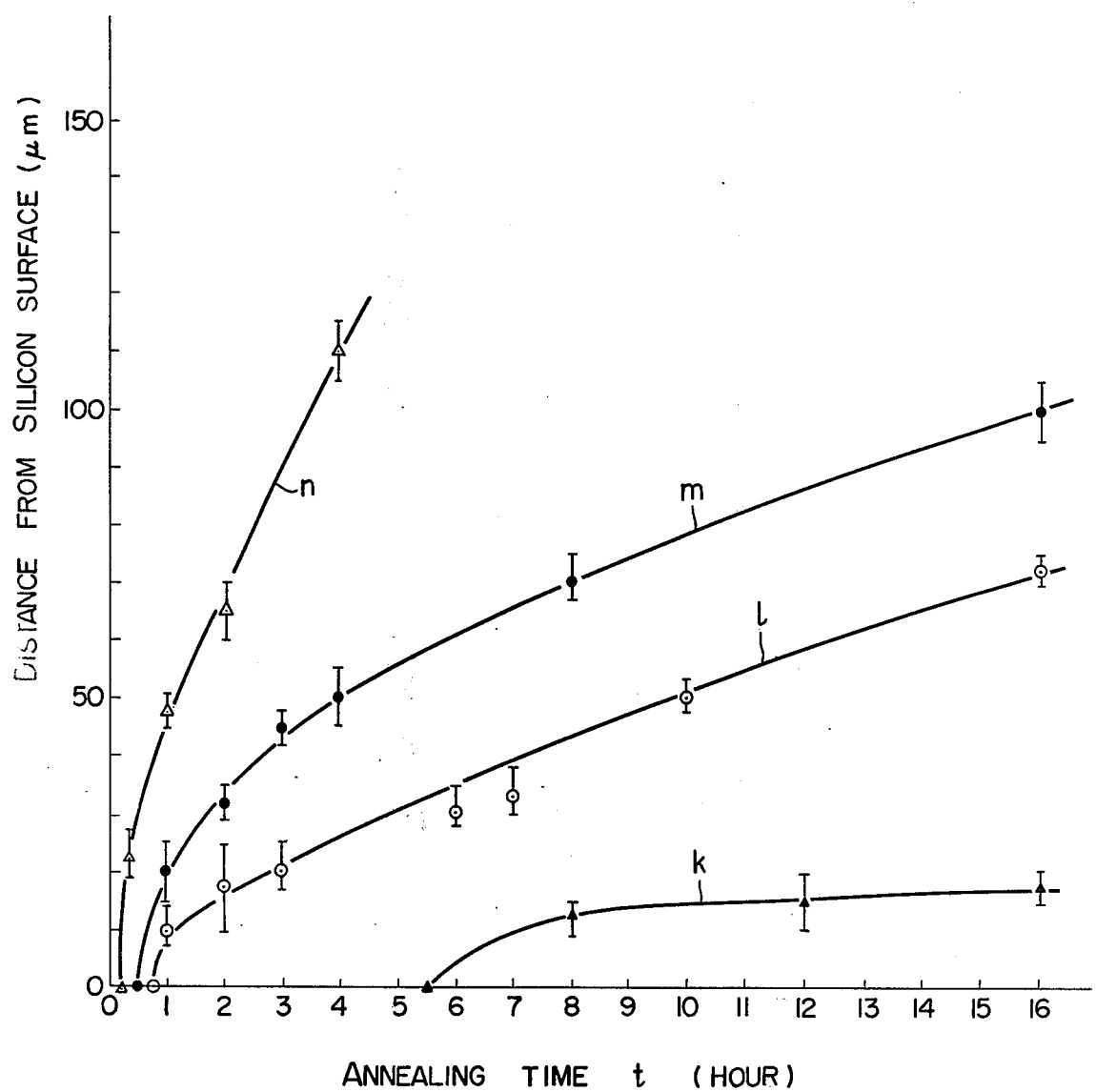

FIG. 10 shows the results of experiments by the present inventors concerning the changes of areas of the silicon wafer 1 from which the stacking faults are eliminated. In the figure, an abscissa indicates the annealing time (hour) and an ordinate indicates an area free of any stacking fault in terms of the depth ($\mu$m) from the silicon wafer surface. Curves k, l, m, and n are plotted for the cases where the annealing temperature is selected to 1100° C, 1150° C, 1200° C and 1250° C, respectively.

Figure 11:
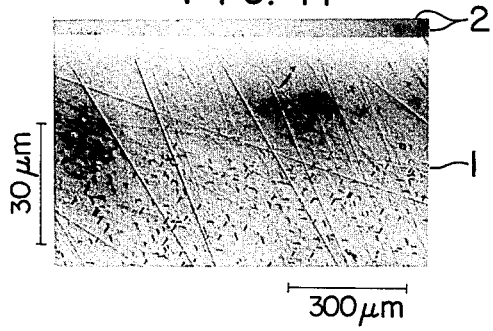
FIGS. 11 to 16 photographically show the results of experiment for explaining the present invention.

FIG. 11 is a photograph of a silicon wafer in cross section after the surface of the silicon wafer 1 was oxidized at high temperatures in an oxidative atmosphere to form a SiO$_2$ film 2 thereon and the structure was annealed in a non-oxidative atmosphere at 1150° C for 3 hours. From the figure, it can be seen that the annealing treatment resulted in the elimination of a stacking fault (appearing in the form of grains) in the depth of 18 $\mu$m from the surface of the wafer 1.

Figure 12:
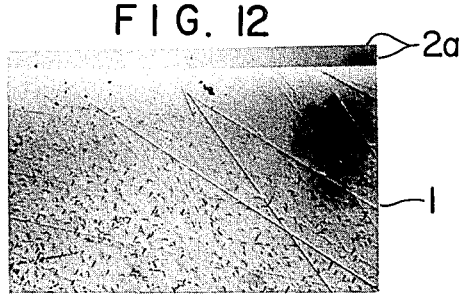

FIG. 12 is a photograph of a silicon wafer in cross section after the silicon wafer 1 subjected to the same treatment as the wafer in FIG. 11 was again oxidized at 1100° C in an oxidative atmosphere to grow a SiO$_2$ film 2a. As apparent from FIG. 12, though the silicon wafer 1 was again oxidized after the annealing thereof no new stacking fault was produced in that area of the silicon wafer 1 from which the previous stacking fault was eliminated by the annealing treatment. Further, there was no increase or growth of the stacking fault which existed in the silicon wafer 1.

Figure 13:
Figure 14:
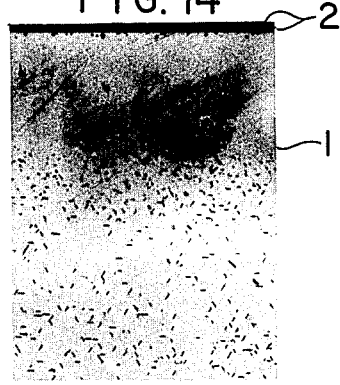
Figure 15:

Each of FIGS. 13 to 15 is a photograph of silicon wafer in cross section after the surface of the silicon wafer 1 was subjected to a heat treatment at high temperatures in an oxidative atmosphere to form a SiO$_2$ film 2 thereon and the silicon wafer was subjected to an annealing treatment at 1150° C for a different time in a non-oxidative atmosphere. In a stage where the heat treatment was carried out, a stacking fault extended through the entire silicon wafer 1. FIGS. 13, 14 and 15 show the silicon wafers after they were subjected to the annealing treatments for 3 hours, 7 hours and 16 hours, respectively. From these figures, it is seen that the area of the elimination of the stacking fault increases with the annealing time.

Figure 16:
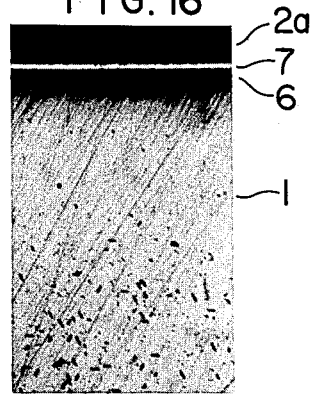

FIG. 16 is a photograph of a silicon wafer in cross section after the surface of the silicon wafer 1 was subjected to a heat treatment at high temperatures in an oxidative atmosphere to form a SiO$_2$ film 2 thereon and result in the generation of a stacking fault in the entire silicon wafer, the wafer was subjected to an annealing treatment at 1150° C for 3 hours in a non-oxidative atmosphere, and boron impurities and phosphorous impurities were subsequently diffused by use of the SiO$_2$ film 2 as a mask to form a P-type layer 6 and a N-type layer 7 while a new SiO$_2$ film 2a were formed on the wafer surface. As apparent from the figure, there generated no new stacking fault in the silicon wafer 1 subjected to the annealing treatment according to the present invention even if the diffusion or reoxidation processes were subsequently carried out to form a PN junction the wafer 1.

A complete elimination of a stacking fault in an area of a silicon wafer where a PN junction is to be formed, according to the present invention, provides an excellent geometry of the formed PN junction and excellent characteristics thereof (especially, characteristics such as breakdown voltage, leakage current characteristic and noise characteristic which are remarkably influenced by the stacking fault). In accordance with the present invention, therefore, the deterioration of the characteristics of the device due to a defect in crystal such as a stacking fault can be prevented and the formation of fine structures can be facilitated, so that the semiconductor device with high performance, high reliability and high integration density can be manufactured with a high yield. Further, the semiconductor device having a PN junction can be manufactured through simple steps.

Though the present invention has been described in conjunction with the specified embodiment, the invention is not limited to such an embodiment. The surface of the silicon wafer may be arbitrary without being restricted to (100) or (111) plane. The conductivity type of the silicon wafer may be arbitrary. A silicon wafer epitaxially grown on a silicon substrate or a gallium arsenide wafer may be used as a starting material. Semiconductor devices manufactured according to the present invention include MIS devices and bipolar semiconductor devices with PN junctions of various configurations which may be of integrated circuit or discrete type.

We claim:

1. A method of making a semiconductor device with a PN junction, comprising the steps of:
    forming an oxidized layer on a major surface of a silicon semiconductor wafer by high temperature oxidation to produce stacking faults in the silicon semiconductor wafer;
    annealing the silicon semiconductor wafer containing the stacking faults in a non-oxidizing atmosphere for a predetermined time and at a predetermined temperature effective to produce at least a zone of the silicon semiconductor wafer having a predetermined depth from said major surface substantially free from the stacking faults, thereby forming a stacking fault free zone having the predetermined depth; and
    forming a PN junction having a depth shallower than said predetermined depth of said zone from said major surface in said zone of the silicon semiconductor wafer.

2. A method according to claim 1, wherein the annealing temperature and the annealing time in said annealing step are within the area (B) of FIG. 9 so as to form the stacking fault free zone having a depth greater than 7 microns.

3. A method according to claim 1, wherein said annealing step is carried out for a period above a time in the range of about 70 to 400 minutes and at a temperature in the range of about 1100° to 1175° C so as to form the stacking fault free zone having a depth greater than 7 microns.

4. A method according to claim 1, wherein said annealing step is carried out for a period above a time in the range of about 40 to 70 minutes and at a temperature in the range of about 1175° to 1200° C so as to form the stacking fault free zone having a depth greater than 7 microns.

5. A method according to claim 1, wherein said annealing step is carried out for a period above approximately one hour and at a temperature above approximately 1150° C so as to form the stacking fault free zone having a depth of more than approximately 10 microns.

6. A method according to claim 1, wherein said annealing step is carried out for a period above approximately 400 minutes and at a temperature above approximately 1100° C so as to form the stacking fault free zone having a depth greater than approximately 7 microns.

7. A method according to claim 1, wherein said annealing step is carried out for a period above approximately 130 minutes and at a temperature above approximately 1150° C so as to form the stacking fault free zone having a depth greater than approximately 7 microns.

8. A method according to claim 1, wherein said annealing step is carried out for a period above approximately 40 minutes and at a temperature above approximately 1200° C so as to form the stacking fault free zone having a depth greater than approximately 7 microns.

9. A method according to claim 2, wherein said depth of the PN junction is less than 7 microns.

10. A method for manufacturing a semiconductor device comprising the steps of:
    annealing a semiconductor substrate with an oxide film formed on the substrate in an non-oxidizing atmosphere;
    removing at least part of said oxide film to expose a surface of said substrate; and
    introducing an impurity to said exposed surface to form a semiconductor region;
    wherein said semiconductor region has a conductivity type opposite to that of the adjacent semiconductor material and defines a PN junction of a predetermined depth with the adjacent semiconductor material, said step of annealing being carried out at such a temperature and for such a period of time to produce in the seimconductor material under said oxide film a substantially stacking fault free zone having a depth deeper than said predetermined depth of said semiconductor region.

11. A method according to claim 10, wherein said annealing is carried out for a period above approximately one hour and at a temperature above approximately 1150° C so as to form the substantially stacking fault free zone having a depth greater than approximately 10 microns.

12. A method according to claim 10, wherein the annealing temperature and the annealing time in said annealing step are within the area (B) of FIG. 9 so as to form the stacking fault free zone having a depth greater than 7 microns.

13. A method according to claim 11, wherein said predetermined depth of the PN junction is less than 10 microns.

* * * * *